(12) United States Patent
Perry

(10) Patent No.: US 11,106,575 B2
(45) Date of Patent: Aug. 31, 2021

(54) SYSTEMS AND METHODS FOR DATA STORAGE IN A MEMORY SYSTEM

(71) Applicant: Western Digital Technologies, Inc., San Jose, CA (US)

(72) Inventor: Nir Perry, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/585,101

(22) Filed: Sep. 27, 2019

(65) Prior Publication Data

US 2020/0104253 A1 Apr. 2, 2020

Related U.S. Application Data

(60) Provisional application No. 62/738,533, filed on Sep. 28, 2018.

(51) Int. Cl.
| | |
|---|---|
| *G06F 12/02* | (2006.01) |
| *G06F 12/14* | (2006.01) |
| *G11C 11/409* | (2006.01) |
| *G06F 9/50* | (2006.01) |
| *G06F 13/16* | (2006.01) |
| *G06F 12/0882* | (2016.01) |

(52) U.S. Cl.
CPC ........ *G06F 12/0246* (2013.01); *G06F 9/5016* (2013.01); *G06F 12/0882* (2013.01); *G06F 12/1425* (2013.01); *G06F 13/1678* (2013.01); *G11C 11/409* (2013.01)

(58) Field of Classification Search
CPC ............ G06F 12/0246; G06F 12/1425; G06F 9/5016; G06F 13/1678; G06F 12/0882; G06F 2212/7202; G06F 9/4881; G11C 11/409; G11C 16/10
See application file for complete search history.

(56) References Cited

U.S. PATENT DOCUMENTS

| | | | | |
|---|---|---|---|---|
| 10,101,942 | B1* | 10/2018 | Parker | G06F 12/0246 |
| 2004/0035939 | A1* | 2/2004 | Lin | G06K 7/0021 235/487 |
| 2016/0078945 | A1* | 3/2016 | Kim | G11C 16/10 365/185.12 |
| 2017/0060470 | A1* | 3/2017 | Jung | G06F 13/4234 |
| 2017/0337136 | A1* | 11/2017 | Basu | G06F 12/1009 |
| 2018/0004419 | A1* | 1/2018 | Thakur | G06F 3/0632 |

* cited by examiner

*Primary Examiner* — David Yi
*Assistant Examiner* — Trung-Hao Joseph Nguyen
(74) *Attorney, Agent, or Firm* — Dickinson Wright PLLC

(57) ABSTRACT

A method includes receiving a first write command from a first data source and determining a first data type associated with the first data source. The method also includes allocating a first page of a memory block to the first data source. The method also writing data to the first page based on the first write command and setting, on the first page, a data type of the first page based on the first data type. The method also includes receiving a read command from one of a plurality of data sources. The method also includes determining a data type associated with the one of the plurality of data sources. The method also includes determining whether to perform the read operation on the first page based on the data type of the first page and the data type associated with the one of the plurality of data sources.

20 Claims, 8 Drawing Sheets

SYSTEMS AND METHODS FOR DATA STORAGE IN A MEMORY SYSTEM

RELATED APPLICATION DATA

This application claims priority to U.S. Provisional Application No. 62/738,533, filed on Sep. 28, 2018, the entire disclosure of which is hereby incorporated by reference as if set forth fully herein.

TECHNICAL FIELD

This disclosure relates to memory systems and in particular, to memory systems having NAND flash memory devices.

BACKGROUND

Non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased. Such memory systems may retain and/or store data received from various sources (e.g., referred to as domains). For example, a memory system may include host data (e.g., user data) and internal management data (e.g., logical-to-physical address mapping tables and the like). Such typical memory systems may separate data received from one data source from data received from another data source (e.g., in a suitably reliable manner). One approach to separating data from respective data sources is to allocate entire memory blocks to respective ones of the various data source. However, physical memory block sizes continue to increase in response to advances in technology. Accordingly, such an approach may be resource intensive, particularly for memory blocks having a relatively large physical size.

SUMMARY

This disclosure relates generally to memory management systems and methods.

An aspect of the disclosed embodiments is a method for storing data in a memory system. The method includes receiving a first write command from a first data source and determining a first data type associated with the first data source. The method also includes allocating a first page of a memory block to the first data source and, during performance of a write operation to the first page: writing data to the first page based on the first write command; and setting, on the first page, a data type of the first page based on the first data type. The method also includes receiving a read command to perform a read operation on the first page from one of a plurality of data sources, the plurality of data sources including the first data source. The method also includes determining a data type associated with the one of the plurality of data sources and determining whether to perform the read operation on the first page based on the data type of the first page and the data type associated with the one of the plurality of data sources.

Another aspect of the disclosed embodiments is a controller that includes a bus interface and a processor. The bus interface is in communication with one or more memory blocks of a memory system. The processor is configured to: receive a first write command from a first data source; determine a first data type associated with the first data source; allocate a first page of a memory block of the one or more memory blocks to the first data source; and during performance of a write operation to the first page: write data to the first page based on the first write command; and set, on the first page, a data type of the first page based on the first data type. The processor is further configured to: receive a read command to perform a read operation on the first page from one of a plurality of data sources, the plurality of data sources including the first data source; determine a data type associated with the one of the plurality of data sources; and determine whether to perform the read operation on the first page based on the data type of the first page and the data type associated with the one of the plurality of data sources.

Another aspect of the disclosed embodiments is a system for storing data in a memory system. The system includes at least one memory block and controller means in communication with the at least one memory block, the controller means configured for: receiving a first write command from a first data source; determining a first data type associated with the first data source; allocating a first page of a memory block to the first data source; and, during performance of a write operation to the first page, writing data to the first page based on the first write command and setting, on the first page, a data type of the first page based on the first data type. The controller means is further configured for: receiving a second write command from a second data source different from the first data source; determining a second data type associated with the second data source; allocating a second page of the memory block to the second data source; and, during performance of a write operating on the second page, writing data to the second page based on the second write command and setting on the second page, a data type of the second page based on the second data type.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
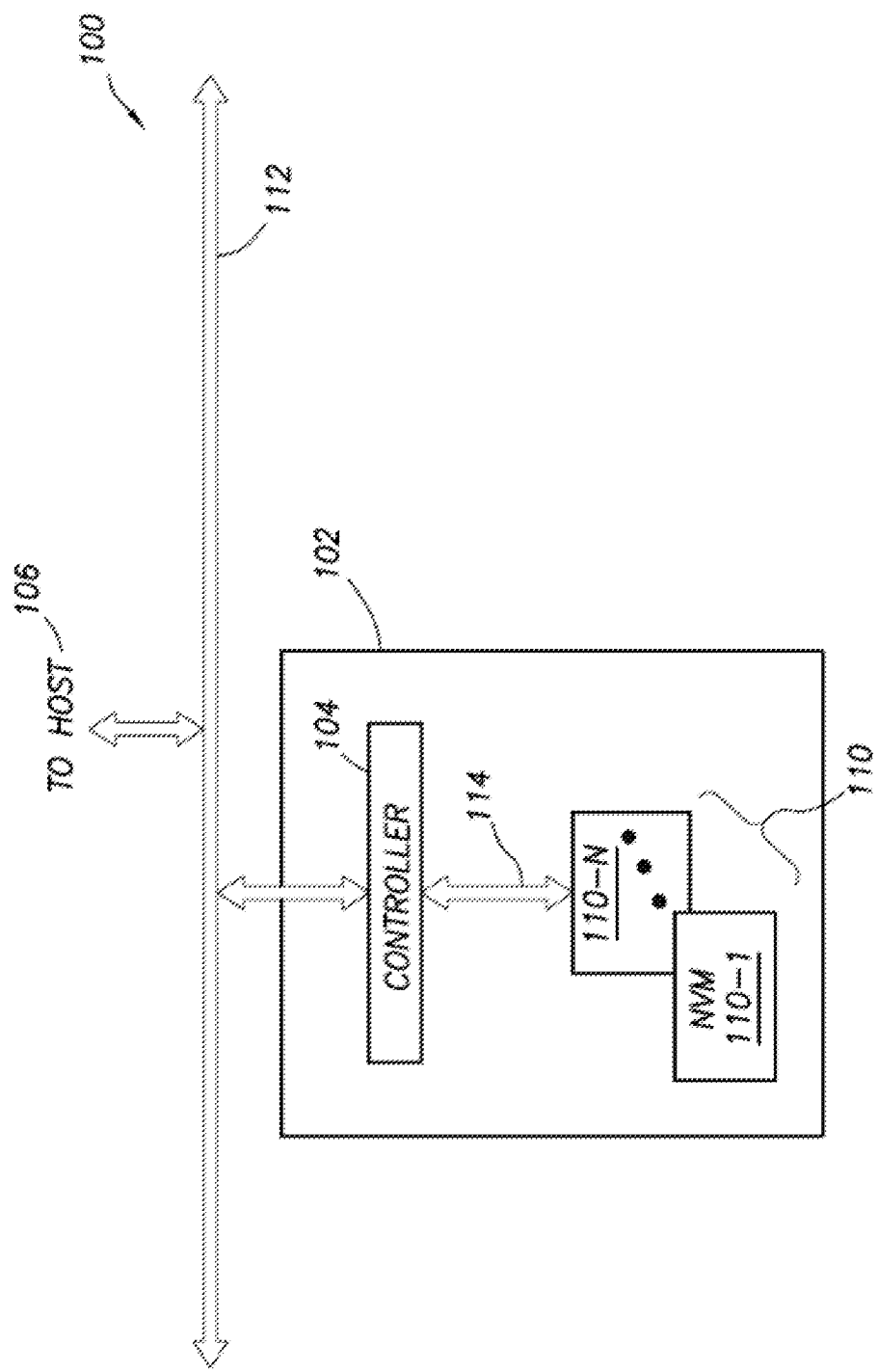
FIGS. 1A-1B generally illustrate a block diagram of an example non-volatile memory system according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Many such memory systems retain and/or store data received from various sources (e.g., referred to as domains). For example, a memory system may include host data (e.g., user data) and internal management data (e.g., logical-to-physical address mapping tables and the like). Additionally, or alternatively, multiple hosts may be connected to a memory system. For example, in some automotive platforms, a corresponding memory system may include a central storage device, which provides memory storage capabilities to multiple clients. In another example, enterprise installations may include a corresponding memory system that may be used for various legacy applications (e.g., each capable of sending respective data) for cost reduction.

Such typical memory systems may separate data received from one data source from data received from another data source (e.g., in a suitably reliable manner). One approach to separating data respective data sources is to allocate entire memory blocks to respective ones of the various data source. For example, such a memory system may allocate a first set of memory blocks to a first data source and a second set of memory blocks to a second data source. However, with technology advances, physical memory block sizes continue to increase. Accordingly, such an approach may be resource intensive, particularly as for relatively memory blocks having a relatively large physical size. Additionally, or alternatively, such an approach may result in lower yields and lower margins for typical memory systems. For example, memory systems that include NAND flash memory do not support in-place writes (e.g., memory blocks allocated to a respective data source must be fully written to before other active blocks can be allocated to the data source). As physical memory block sizes increase for such a memory system, the amount of time it takes to write to each allocated memory block until each allocated memory block is full, increases, which may increase production and operating costs.

Accordingly, systems and methods, such as those described herein, that are configured to separate data from respective data sources while improving yields and reducing production and/or operating costs, may be desirable. In some embodiments, the systems and methods described herein may be configured to reduce the dependency on memory block size by mixing data from different data sources together in a single memory block or by sharing a NAND page. For example, a host often instructs a controller of the memory system to perform operations, such as write operations, read operations, and the like, on pages having a size of 4 kilobyte (KB). However, NAND pages may be larger (e.g., 16 KB). Accordingly, the systems and methods described herein may be configured to store multiple 4 KB pages of data received from multiple respective data sources on a single NAND page.

In some embodiments, the systems and methods described herein may be configured to protect each page with a specific data type indication. For example, the systems and methods described herein may be configured to embed, in a respective page, during performance of a write operation, a data type corresponding to a respective data source that provided the data stored on the page. The systems and methods described herein may be configured to verified and/or check the data type of the page during performance of a read operation by an error correction code (ECC) hardware engine of the controller.

For example, pages may include spare bits that are typically used to store redundant bits, which may allow the ECC engine to compensate for bit errors. The systems and methods described herein are configured to allocate a relatively small data type field as part of the spare bits of a page that will be encoded with the page. In some embodiments, the systems and methods described herein may be configured to instruct the ECC engine to read a page. The systems and methods described herein are configured to communicate a data type corresponding to a data source instructing the ECC engine to read data from and/or write data to the page. The ECC engine may then compare the data type corresponding to the data source with the data type of the page. If the ECC engine determines that the data type corresponding to the data source is the same as the data type of the page, the ECC engine reads data from and/or writes data to the page. Conversely, if the ECC engine determines that the data type corresponding to the data source is not the same as the data type of the page, the ECC engine will not read data from and/or write data to the page. In this manner, the systems and methods described herein may be configured to verify in hardware that the page being read from and or written to belongs to that data type of the data source instructing the ECC engine to read data from and/or write data to the page (e.g., and prevent incorrect data from being returned). Additionally, or alternatively, because pages are always read through the ECC engine, the systems and methods described herein guarantee protection in hardware, which may be easier to qualify and guarantee than a firmware solution.

In some embodiments, the systems and methods described herein may be configured to receive a first write command from a first data source and determine a first data type associated with the first data source. The systems and methods described herein may be configured to allocate a first page of a memory block to the first data source. The systems and methods described herein may be configured to, during performance of a write operation to the first page, write data to the first page based on the first write command and set, on the first page, a data type of the first page based on the first data type. The systems and methods described herein may be configured to receive a second write command from a second data source different from the first data source and determine a second data type associated with the second data source. The systems and methods described herein may be configured to allocate a second page of the memory block to the second data source. The systems and methods described herein may be configured to, during performance of a write operating on the second page, write data to the second page based on the second write command and set on the second page, a data type of the second page based on the second data type.

In some embodiments, the systems and methods described herein may be configured to receive a read command to perform a read operation on one of the first page and the second page from one of a plurality of data sources. The systems and methods describe herein may be configured to determine a data type associated with the one of the plurality of data sources and determine whether to perform the read operation on the one of the first page and the second page based on the data type of the one of the first page and the second page and the data type associated with the one of the plurality of data sources.

FIG. 1A illustrates a block diagram of an example system architecture 100 including non-volatile memory. In particular, the example system architecture 100 includes storage system 102 (e.g., which may be referred to as a memory system), a controller 104, and a host 106. In various embodiments, the host 106 can include any device or system that utilizes the storage system 102. In some embodiments, various aspects of the controller 104 may be implemented by the host 106 or the host 106 can include its own controller (e.g., a processor) configured to execute instructions stored in the storage system 102 and further the host 106 can access data stored in the storage system 102.

Examples of the host 106 include computing devices such as a desktop computer, rack mounted server, a laptop, a smartphone, a tablet, or other suitable computing devices. Host 106 can also include systems and devices such as a gaming system, a digital phone, a digital camera (e.g., digital still cameras and digital movie cameras), portable media player, digital photo frame, remote control, television stick, smart television, and the like. Furthermore, the system architecture 100 can be implemented in a memory card such as secure digital (SD) card or a micro secure digital (micro-SD) card. In some embodiments, the system architecture 100 is embedded in the host, for example as a solid-state disk (SSD) drive installed in a laptop computer.

In embodiments where the system architecture 100 is implemented within a memory card, the host 106 can include a built-in receptacle for one or more types of memory cards or flash drives (e.g., a universal serial bus (USB) port, or a memory card slot). Additionally, or alternatively, the host 106 can include adapters into which a memory card may be plugged. The foregoing examples of a host are not meant to be limiting examples. On the contrary, a host 106 can include any type of device, system, and apparatus that accesses the storage system 102.

In FIG. 1A, the storage system 102 includes a memory controller and drivers (e.g., controller 104)—as will be described further below—however, in some embodiments of the storage system 102, the storage system 102 may include memory-only units that are instead controlled by software executed by a controller on the host 106 (e.g., a processor of a computing device controls, including error handling of, the storage system 102). Furthermore, although FIG. 1A illustrates the storage system 102 as separate from the host 106, in some embodiments, the storage system 102 is embedded with the host 106, where the memory, controller, and drivers are formed on a single integrated circuit chip.

The host 106 can communicate with the storage system 102 using of a bus 112 that implements any known or after developed communication protocol that enables the storage system 102 and the host 106 to communicate. The communication protocol may include Secure Digital (SD) protocol, Memory stick (MS) protocol, USB protocol, Advanced Microcontroller Bus Architecture (AMBA), or other suitable communication protocol.

In various embodiments, the controller 104 acts as an interface between the host 106 and the storage system 102. The host 106 may communicate with the controller 104 via a bus interface associated with the bus 112. The controller 104 can include individual circuit components, processing circuitry (e.g., logic gates and switches), a processor, a microprocessor, a microcontroller with controlling software, or a field programmable gate array (FPGA). Furthermore, the example controller 104 includes a computer-readable medium that stores computer-readable program code (e.g., software or firmware) executable by the processor. In some embodiments, the controller 104 is a flash memory controller. In some embodiments, the controller 104 is a processor executing within the host 106.

Still referring to FIG. 1A, according to some embodiments, the controller 104 acts as an interface between the host 106 and the storage system 102 and manages data stored on the storage system 102. For example, the controller 104 may receive commands or instructions from the host 106 and may perform read operations, write operations, programming operations, erase operations, other suitable operations, or a combination thereof on the memory of the storage system 102 in response to the commands or instructions communicated by the host 106. The host 106 can access data stored in the storage system 102 by providing a logical address, via the bus interface associated with the bus 112, to the controller 104, which, the controller 104 converts to a physical address. The controller 104 can access data and/or a particular storage location associated with the physical address and facilitate transferring data between the storage system 102 and the host 106. In some embodiments, where the storage system 102 includes flash memory, the controller 104 formats the flash memory to ensure the memory is operating properly, maps out bad flash memory cells, and allocates spare cells to be substituted for future failed cells or used to hold firmware to operate the flash memory controller (e.g., the controller 104).

Accordingly, the controller 104 performs various memory management functions such as wear leveling (e.g., distributing writes to extend the lifetime of the memory blocks), garbage collection (e.g., moving valid pages of data to a new block and erasing the previously used block), and error detection and correction (e.g., read error handling).

Still referring to FIG. 1A, the storage system 102 includes the non-volatile memory (NVM) block 110 which may include several memory die 110-1-110-N. In some embodiments, the NVM block 110 defines a physical set of memory die, such as the memory die 110-1-110-N. In other embodiments, the NVM block 110 defines a logical set of memory die, where the NVM block 110 includes memory die from several physically different sets of memory die. The manner in which the NVM block 110 is defined in FIG. 1A is not meant to be limiting.

Each memory die, for example memory die 110-1, includes non-volatile memory cells, such as NAND flash memory cells, NOR flash memory cells, or other suitable memory cells. As the memory cells are non-volatile, the memory cells in the storage system 102 retain data even when there is an interruption in power supplied to the memory cells and/or the storage system 102. Thus, the storage system 102 can be easily transported and the storage system 102 can be used in memory cards and other memory devices that are not always connected to a power supply.

In various embodiments, the memory cells in the memory die 110 are solid-state memory cells (e.g., flash) and are one-time programmable, few-time programmable, or many time programmable. Additionally, the memory cells in the memory die 110 can include single-level cells (SLC or 1-bit/cell), multiple-level cells (MLC or 2-bits/cell), triple-level cells (TLC or 3-bits/cell), or quad-level cells (QLC or 4-bits/cell). In some embodiments, the memory cells are fabricated in a planar manner (e.g., 2D NAND (NOT-AND) flash) or in a stacked or layered manner (e.g., 3D NAND flash). That is, planar flash memory includes a single layer of memory cell, while stacked flash memory includes memory cells that are stacked vertically in multiple layers (e.g., referred to as planes).

In some embodiments, and as shown in FIG. 1A, the controller 104 and the NVM block 110 are communicatively coupled by an interface 114 that implements any known or after developed communication protocol. In embodiments where the storage system 102 is flash memory, the interface 114 is a flash interface, such as Toggle Mode 200, 400, 800, or Common Flash Memory Interface (CFI). In various embodiments, the interface 114 can be implemented by several channels (i.e., physical connections) disposed between the controller 104 and the individual memory die 110-1-110-N. Furthermore, the number of channels over which the interface 114 is established varies based on the capabilities of the controller 104. Additionally, a single channel can be configured to communicatively couple more than one memory die. The depiction of a single interface 114 is not meant to be limiting. To the contrary, the single interface is representative of an example interface that can be used between components, and one or more interfaces can be used to communicatively couple the same components.

Figure 1B:
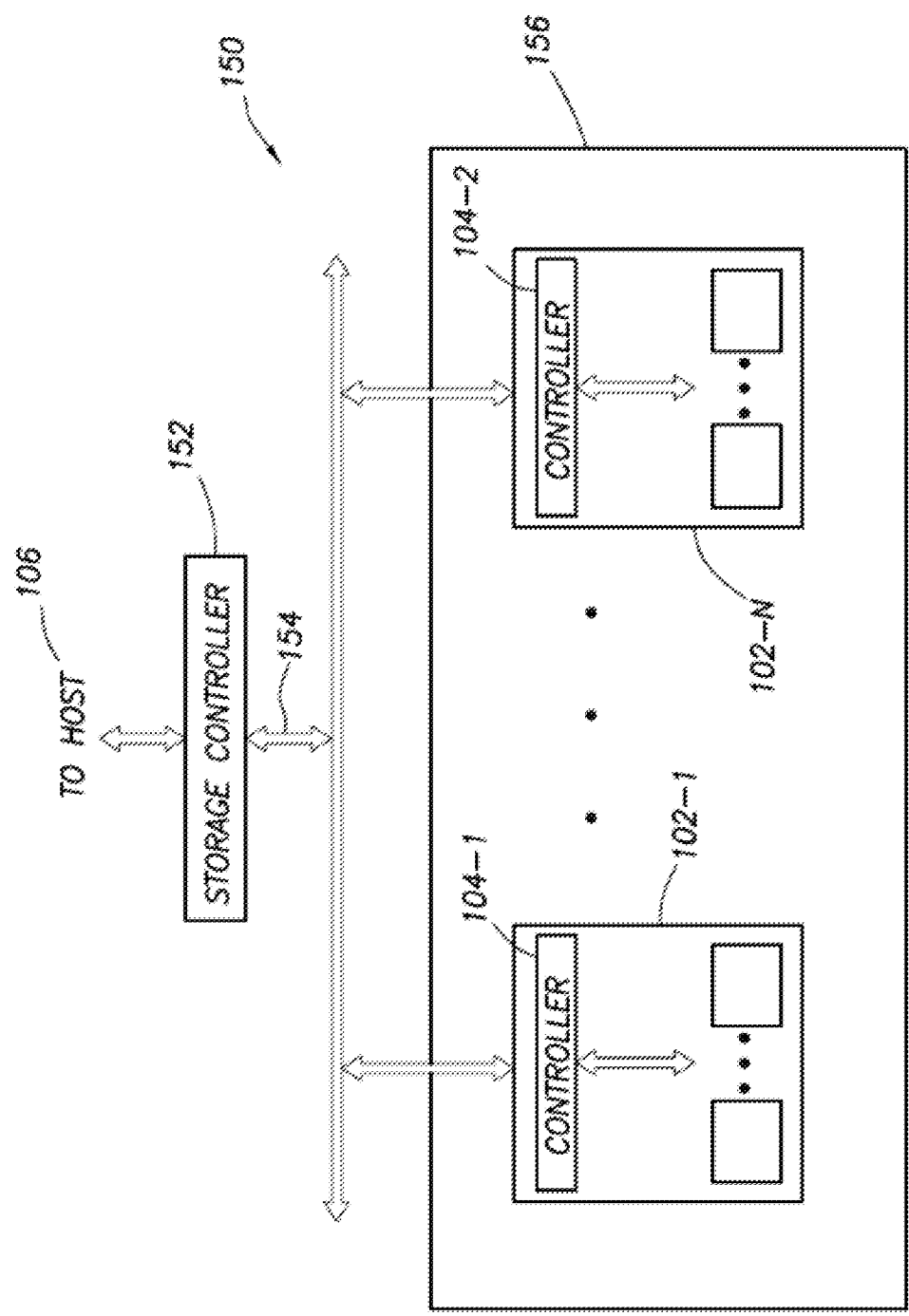

FIG. 1B generally illustrates a block diagram of the system architecture 100 according to the principles of the present disclosure. The system architecture 100 can be implemented as part of a larger system architecture. For example, as shown in FIG. 1B, the system architecture 150 includes a storage module 156 that further includes several storage systems 102. Within the example system architecture 150, the storage module 156 is communicatively coupled with the host 106 by way of a storage controller 152. In particular, an interface 154 between the host 106 and the storage module 156 includes a bus interface that implements any known or after developed communication protocol, such as a serial advanced technology attachment (SATA) or peripheral component interface express (PCIe) interface. In some embodiments, the storage module 156 is an SSD (e.g., in a laptop computer or a tablet).

Some implementations of the system architecture 100 include a hierarchical storage system. A hierarchical storage system can include a plurality of storage controllers 152, each of which control a respective storage system 102. Furthermore, a plurality of hosts 106 can each access the hierarchical storage system. Hosts 106 can access memories within the hierarchical storage system via a bus interface that implements any known or after developed communication protocol including a non-volatile memory express (NVMe) or a fiber channel over Ethernet (FCoE) interface. The hierarchical storage system can be implemented as a rack mounted storage system that is accessible by multiple host computers (e.g., a data center).

The interface 154 can be implemented by several channels (i.e., physical connections) disposed between the storage controller 152 and the storage module 156. In some embodiments, the number of channels over which an interface 154 is established varies based on the capabilities of the storage controller 152. The depiction of a single interface is not meant to be limiting and the single interface is representative of an example interface that can be used between components, where one or more interfaces can be used to communicatively couple various components.

Figure 2A:
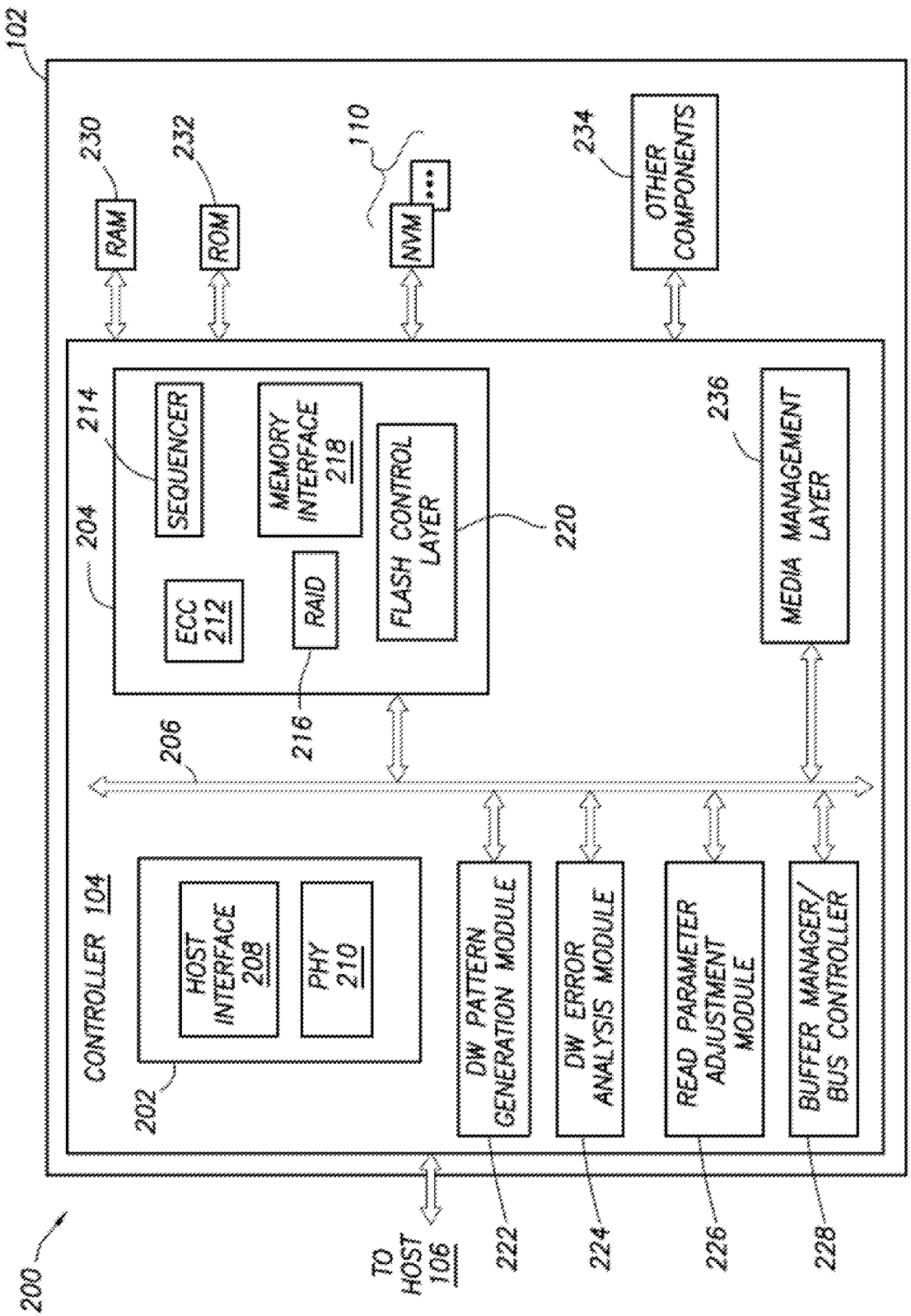
FIG. 2A generally illustrates a block diagram of example components of a controller according to the principles of the present disclosure.

FIG. 2A generally illustrates a block diagram 200 of the storage system 102, according to the principles of the present disclosure. The block diagram 200 of the storage system 102 includes components previously described in FIG. 1A, such as the controller 104 and the NVM memory block 110. Additional components that can be present within the storage system 102 include a random access memory (RAM) 230, a read only memory (ROM) 232, and other components 234. In some embodiments, the ROM 232 stores system boot code.

Although the RAM 230 and the ROM 232 are shown as separate modules within the storage system 102, the illustrated architecture is not meant to be limiting. For example, the RAM 230 and the ROM 232 can be located within the controller 104. In some embodiments, portions of the RAM 230 or ROM 232, respectively, are located outside the controller 104 and within the controller 104. In other embodiments, the controller 104, the RAM 230, and the ROM 232 can be located on separate semiconductor die. In various embodiments, the other components 234 include external electrical interfaces, external RAM, resistors, capacitors, logic gates, or other components that interface with the controller 104.

In some embodiments, the controller 104 includes a module 202 that interfaces with the host 106, a module 204 that interfaces with the NVM memory block 110, as well as various other modules, described further below. The modules within the controller (e.g., modules 202 and 204) are communicatively coupled to each other by a bus 206.

The following discussion of the various modules depicted within the controller 104 are meant to be illustrative and not limiting. For example, the various modules generally illustrated in FIG. 2A are not limited to being executed within the controller 104, and in some embodiments, one or more modules can be executed outside the controller 104.

The module 202 interfaces with the host 106 and includes a host interface 208 and a physical layer interface 210 that provides the electrical interface between the host 106 or next level storage controller and the controller 104. The host interface 208 facilitates transferring of data, control signals, and timing signals. Examples of the host interface 208 include SATA, SATA express, Serial Attached SCSI (SAS), Fibre Channel, USB, PCIe, and NVMe.

Still referring to FIG. 2A, in various embodiments, the module 204 is configured to communicate with the NVM block 110 and includes an error correcting code (ECC) engine 212. In some embodiments, the ECC engine 212 encodes data received from the host 106 and stores the encoded data in the NVM block 110. When the data is read out from the NVM memory block 110, the ECC engine 212 decodes the data and corrects errors detected within the data To detect errors, the ECC engine 212 implements various types of error checking using algorithms such as low-density parity-check (LDPC) code, Bose-Chaudhuri-Hocquenghem (BCH) code, a soft read, and/or extra parity.

The example module 204 also includes a sequencer 214 and a Redundant Array of Independent Drives (RAID)

module 216. In various embodiments, the sequencer 214 generates command sequences, such as program and erase command sequences that are transmitted to the NVM memory block 110. The RAID module 216 generates RAID parity and recovery of failed data. The RAID parity can be used to provide an additional level of integrity protection for data written into the NVM memory block 110. In some embodiments, the ECC engine 212 implements the functions of the RAID module 216.

The example module 204 also includes a memory interface 218 that provides the command sequences to the NVM memory block 110 and receives status information from the NVM memory block 110. For example, the memory interface 218 implements any known or after developed communication protocol including a double data rate (DDR) interface, such as a Toggle Mode 200, 400, or 800 interface. The module 204 also includes a flash control layer 220 that controls the overall operation of the module 204.

Still referring to example modules within the controller 104 in FIG. 2A, additional modules within the controller 104 includes a dummy word line (DW) pattern generation module 222, a DW error analysis module 224, and a read parameter adjustment module 226. Dummy word lines are placed on non-volatile memory die that are used for the purposes of analyzing and tracking behavior and health of a respective non-volatile memory die. In various embodiments, the DW pattern generation module 222 puts a known data pattern into a dummy word line and tracks or periodically check for errors by reading the data back out of the dummy word line and comparing the data to the known data pattern.

In various embodiments, the read parameter adjustment module 226 adjusts parameters associated with a particular non-volatile memory die. For example—and as discussed further below—the read parameters adjustment module 226 can adjust parameters associated with a particular non-volatile memory die during an operation—i.e., a read or write—to adjust or re-adjust the read parameters. During the operation to re-adjust the read parameters, the read parameter adjustment module 226 adjusts the read parameters for a particular memory block, reads data out of the memory block, and verifies a resulting Bit Error Rate (BER). If the resulting BER falls at or below a target or expected BER, the read parameters adjustment module 226 stores the read parameters for the memory block. Subsequently, the stored read parameters are used during a read of any word line within the memory block. Thus, read parameters can be unique to a memory block.

Additional modules within the example controller 104 include a buffer manager/bus controller 228 that manages, for example, buffers in the RAM 230 and controls the internal bus arbitration of the bus 206 in the controller 104. Additionally, or alternatively, the controller 104 can include a media management layer 236 that performs wear leveling of the NVM memory block 110. As previously mentioned, the various modules described with respect to the controller 104 are not meant to be limiting as to the architecture of the controller 104. For example, the physical layer interface 210, the RAID module 216, the media management layer 236, and the buffer management/bus controller 228 can be examples of optional components within the controller 104.

Furthermore, in embodiments where the storage system 102 includes flash memory, the media management layer 236 can be integrated as part of the flash management that handles flash error and interfaces with the host 106. In particular, the media management layer 236 can include an algorithm (e.g., firmware in the memory device), that translates a write command received from the host 106 into a write to the NVM memory block 110.

Figure 2B:
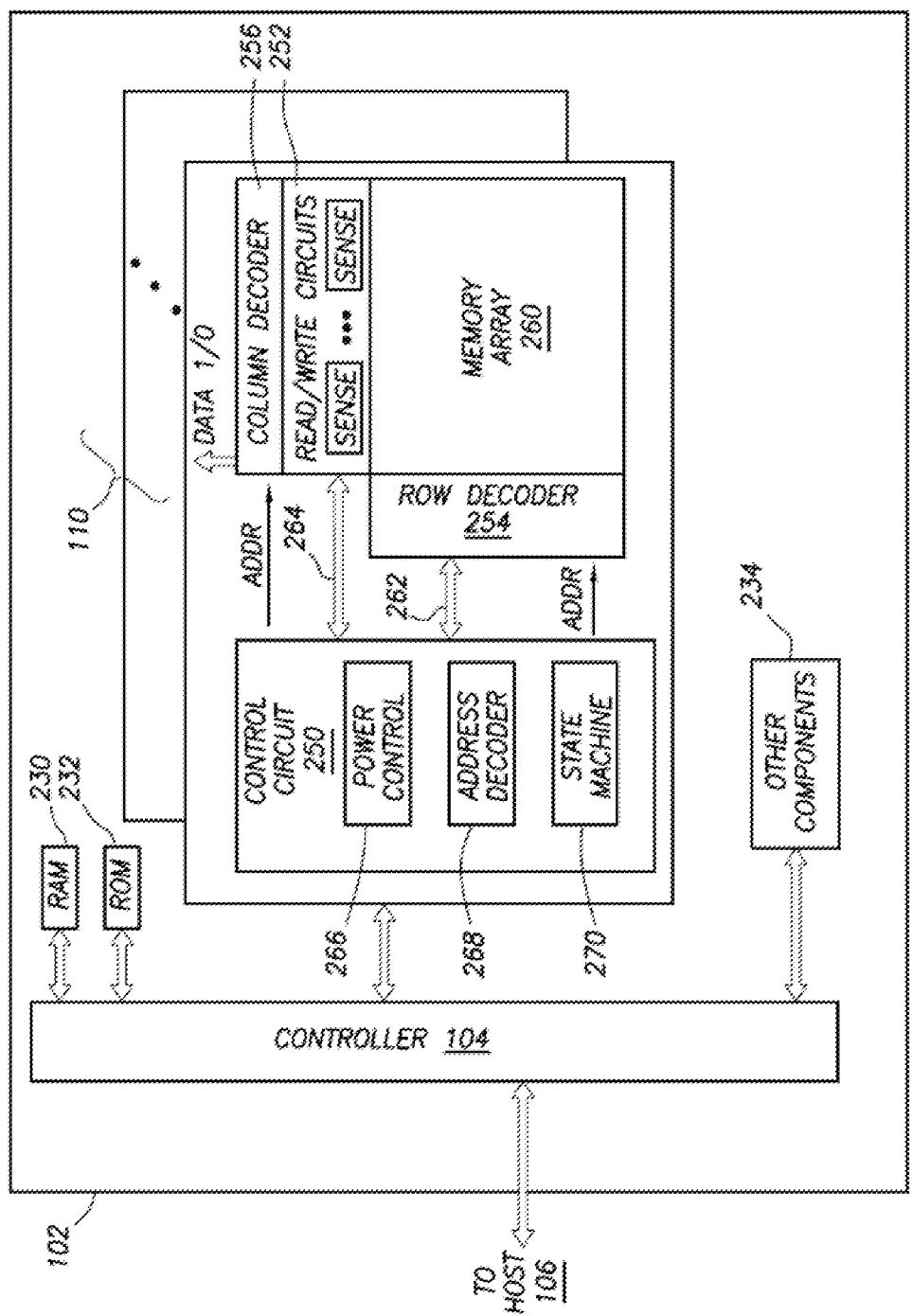
FIG. 2B generally illustrates a block diagram of example components of a non-volatile memory storage system according to the principles of the present disclosure.

FIG. 2B generally illustrates a block diagram with various features of the NVM memory block 110 within the storage system 102. As details of the controller 104 have been previously described (in FIG. 2A), in FIG. 2B the controller 104 is illustrated as a single block. Additionally, previously described RAM 230, the ROM 232, and the other components 234 are included in FIG. 2B to help orient the reader. Next, details within an example memory die 110-1 are discussed. Although the discussion centers on the memory die 110-1, each of the features discussed in relation to the memory die 110-1 equally applies to all of the memory dies within NVM memory block 110.

In some embodiments, the example memory die 110-1 includes control circuit 250, read/write circuits 252, a row decoder 254, a column decoder 256, and a memory array 260. The memory array 260 can include a two-dimensional array or a three-dimensional array of memory cells. The read/write circuits 252 read and program pages of memory within the memory die 110-1, in parallel. In various embodiments, the memory array 260 is accessed by word lines via the row decoder 254 and by bit lines via the column decoder 256.

The architecture of the memory die 110-1 is not meant to be limiting and any known architecture that can perform the functions of accessing the memory array 260 can be used without departing from the scope of this disclosure. For example, in various embodiments, access to the memory array 260 by various peripheral circuits can be implemented in a symmetric fashion on opposite sides of the memory array 260, which reduces the densities of access lines, and circuitry on each side of the memory array 260.

Still referring to FIG. 2B, in various embodiments, the example control circuit 250 includes a power control circuit 266, an address decoder 268, and a state machine 270. In some embodiments, the power control circuit 266, the address decoder 268, and the state machine 270 can be collectively referred to as managing circuits. The control circuit 250 and its various managing circuits are communicatively coupled by various interfaces (e.g., interfaces 262 and 264) to the row decoder 254 and the column decoder 256. In various embodiments, the control circuit 250 performs various operations on the memory array 260 that include reading or writing to the memory cells.

The power control circuit 266 controls the power and voltage supplied to the word lines and bit lines during operation of the memory array 260. The address decoder 268 provides an address interface that translates addresses between addresses provided by the host 106 and addresses used by the row decoder 254 and the column decoder 256. The example address decoder 268 converts an address provided by the host 106 to an address that is understood and compatible with a format used by the row decoder 254 and the column decoder 256. The state machine 270 provides chip-level control of memory operations.

Thus, the storage system 102 includes various components including the controller 104 and the NVM memory block 110, details of which have been described above in FIGS. 1A, 1B, 2A, and 2B. The discussion now turns to an example architecture of an example memory array 260 and in particular methods that can be performed to improve a performance of a read in the storage system 102.

Figure 3:
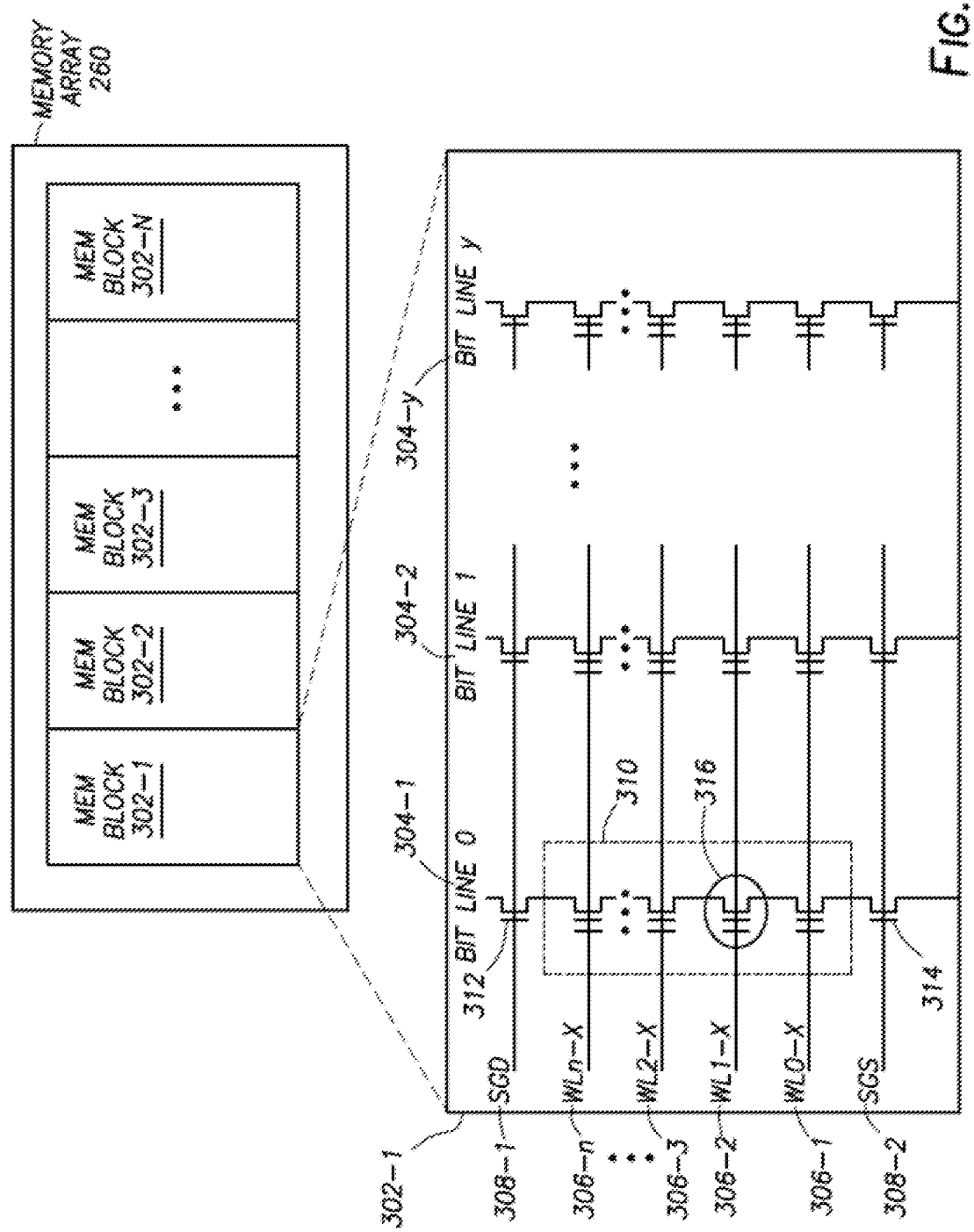
FIG. 3 generally illustrates a memory block according to the principles of the present disclosure.

FIG. 3 further illustrates the memory array 260. The memory array 260 is divided into several memory blocks 302. In flash memory, a memory block is defined as a unit of erase. That is, each memory block 302 includes a number of memory cells that are erased together or as a block. In some embodiments, the memory array 260 can be partitioned into any number of blocks, for example, the memory array 260 includes 1,024 blocks. Additionally, or alternatively, each of the memory blocks 302 can conceptually be divided into a number of pages defined as a unit of programming. In some embodiments, a page of data can be stored in one row of memory cells. Each page can include user data and overhead data, where the overhead data includes correction code (CC) that has been calculated from the user data. In some embodiments, the memory blocks 302-1 to 302-N may include solid-state NAND memory blocks.

Each memory block 302, for example memory block 302-1, includes multiple bit lines 304, word lines 306, and select lines 308. Each bit line, for example bit line 304-1, is connected to several memory cells connected in series. More particularly, in an embodiment where each memory cell is a floating gate transistor, the floating gate transistors are connected in series to form a NAND string 310 (e.g., illustrated within the dashed box). Although four memory cells are shown in FIG. 3, the number of memory cells within the NAND string is not meant to be limiting. For example, 16, 32, 64, 128, or any other number of memory cells can be connected in a NAND string. Each respective bit line 304 is coupled to a respective NAND string within the block 302.

Still referring to FIG. 3, a method of reading data stored in a particular memory cell—e.g., memory cell 316—includes applying a voltage to the select lines 308 of the block 302, which in turn are coupled to respective NAND strings within the block 302, including the NAND string 310 the includes the memory cell 316. The voltage applied to the select lines 308 is greater than threshold voltages of the select transistors 312 and 314. The select transistor 312 is controlled by the select gate drain line (SGD) 308-1 and the select transistor 314 is controlled by the select gate source line (SGS) 308-2. Additionally, in order to read data in the memory cell 316, all other memory cells or unselected memory cells in the NAND string 319 are turned on (e.g., conducting current regardless of whether they are programmed or erased). The unselected memory cells have a read pass voltage—i.e., read parameters—applied to their respective word lines that turn on the unselected memory cells.

During the example read operation, various read compare levels—i.e., voltages—are applied to the word line 306-2 to determine the value stored in the memory cell 316. In some embodiments, the conduction current of the memory cell 316 is measured to determine the value stored within the memory cell 316. The method in which each memory cell is accessed and the number of memory cells accessed during a read or write varies. For example, all of the bit lines of the memory block 302-1 can be simultaneously programmed or read. In various embodiments, memory cells along a shared word line can be programmed at the same time (i.e., concurrently). In other embodiments, the bit lines can be divided into even bit lines and odd bit lines. In an odd/even bit line architecture, memory cells along a shared word line and connected to the odd bit lines are programmed at one time, while memory cells along a shared word line and connected to an even bit line are programmed at a different time.

Each time data is written to a memory block the data is processed by the ECC engine 212 which includes encoding the data (e.g., using a particular error correction code) and storing the encoded data in the memory block. When the data is read back out of the memory block, the data is processed by the ECC engine 212 which includes decoding the data, correcting errors (e.g., tracked as the BER), and returning the data to a user (by way of the controller 104). In some embodiments, the amount of time the ECC engine 212 takes to return data to the controller 104 is defined as the throughput time.

In some embodiments, the controller 104 performs data consolidation operations on the memory array 260. The controller 104 selects a source block from the memory block 302-1 to memory block 302-N of the memory array 260, for consolidation or compaction. For example, the controller 104 may select memory block 302-1 as the source block for consolidation or compaction. The memory block 302-1 may be referred to as the source block 302-1 throughout the example embodiments described herein. The source block 302-1 may include a plurality of memory fragments, such as 16 memory fragments or any suitable number of memory fragments. The memory fragments may include data written by the host 106 during a host write operation. The memory fragments may belong to respective logical groups and may be scattered or disorganized in the source block 302-1, such that memory fragments associated with the same logical group may not be sequentially stored or organized in the source block 302-1. Additionally, or alternatively, while some memory fragments include data written by the host 106 during a host write operation, other memory fragments scattered throughout the source block 302-1 may be blank (e.g., having been erased by the host 106 or the controller 104 or having not been written to by the host 106).

As described, the controller 104 may be configured to store data from a respective data source in the storage system 102, separate from data from other data sources. For example, the controller 104 may receive data from a plurality of data sources and may store data from each respective data source of the plurality of data sources separate from one another. The plurality of data sources may include the host 106, one or more other hosts, an internal management data source (e.g., that manages transition tables, as described), one more applications associated with the memory system, any other suitable data source, or a combination thereof.

As described, the controller 104 receives instructions to perform various operations on the storage system 102. For example, the controller 104 may receive a first write command from a first data source, such as the host 106 and a second write command from a second data source, such as another host or other suitable data source. The controller 104 is configured to determine data type associated with the first data source and a data type associated with the second data source. Each respective data type may indicate a type of data (e.g., host data or other suitable data) and/or a data source (e.g., the host 106, the other host, or any other suitable data source). The controller 104 may be configured to allocate one or more pages of a respective memory block, such as the memory block 302-1, to a respective data source. For example, the controller 104 may allocate a first page of the memory block 302-1 to the first data source and a second page of the memory block 302-1 to the second data source. The first and second pages may include page sizes of 4 KB or other suitable page size. In some embodiments, the first and the second pages are a 4 KB (e.g., or other suitable size) portions of a single NAND page (e.g., having a page size of 16 KB or other suitable size).

The controller 104 may be configured to instruct the ECC engine 212 to perform a write operation on the first page according to the write command received from the first data source (e.g., the host 106). The controller 104 communicates, with the instruction to perform the write operation, the data type associated with the first data source to the ECC engine 212. The ECC engine 212 is configured to write data to the first page, as described. During performance of a write operation, the ECC engine 212 sets the data type of the first page. For example, the ECC engine 212 stores a value in one or more bits of the first page that indicates the data type of the first data source.

The controller 104 may be configured to instruct the ECC engine 212 to perform a write operation on the second page according to the write command received from the second data source (e.g., the host 106). The controller 104 communicates, with the instruction to perform the write operation, the data type associated with the second data source to the ECC engine 212. The ECC engine 212 is configured to write data to the second page, as described. During performance of a write operation, the ECC engine 212 sets the data type of the second page. For example, the ECC engine 212 stores a value in one or more bits of the second page that indicates the data type of the second data source. It should be understood that, while only a first and second data source and corresponding write commands are described, the controller 104 may receive instructions to perform operations from any suitable number of data sources.

In some embodiments, the controller 104 is further configured to receive a read command to perform a read operation on a page of the memory block 302-1 (e.g., or any other memory block of the storage system 102). For example, the controller 104 may receive a read command to perform a read operation on the first page from a respective data source. The controller 104 may determine a data type associated with the respective data source, as described. The controller 104 communicates the data type of the respective data source to the ECC engine 212 and instructs the ECC engine 212 to perform the read operation on the first page according to the read command.

The ECC engine 212 may be configured to determine whether to perform the read operation on the first page based on the data type of the respective data source and the data type of the first page. For example, the ECC engine 212 compares the data type of the respective data source with the data type of the first page. When the ECC engine 212 determines that the data type of the respective data source is the same as the data type of the first page, the ECC engine 212 performs the read operation on the first page, as described. Conversely, when the ECC engine 212 determines that the data type of the respective data source is not the same as the data type of the first page, the ECC engine 212 does not perform the read operation on the first page (e.g., to limit access to the data stored on the first page to data sources having a data type corresponding to the data type of the first page). The ECC engine 212 may indicate to the controller 104 that the read operation was not performed and/or that the respective data source does not have permission and/or access rights to access the data stored on the first page. The controller 104 and/or the ECC engine 212 may continue in this manner in order to control access to the data stored in the storage system 102 and/or to ensure that incorrect data is not returned to a respective data source.

Figure 4:
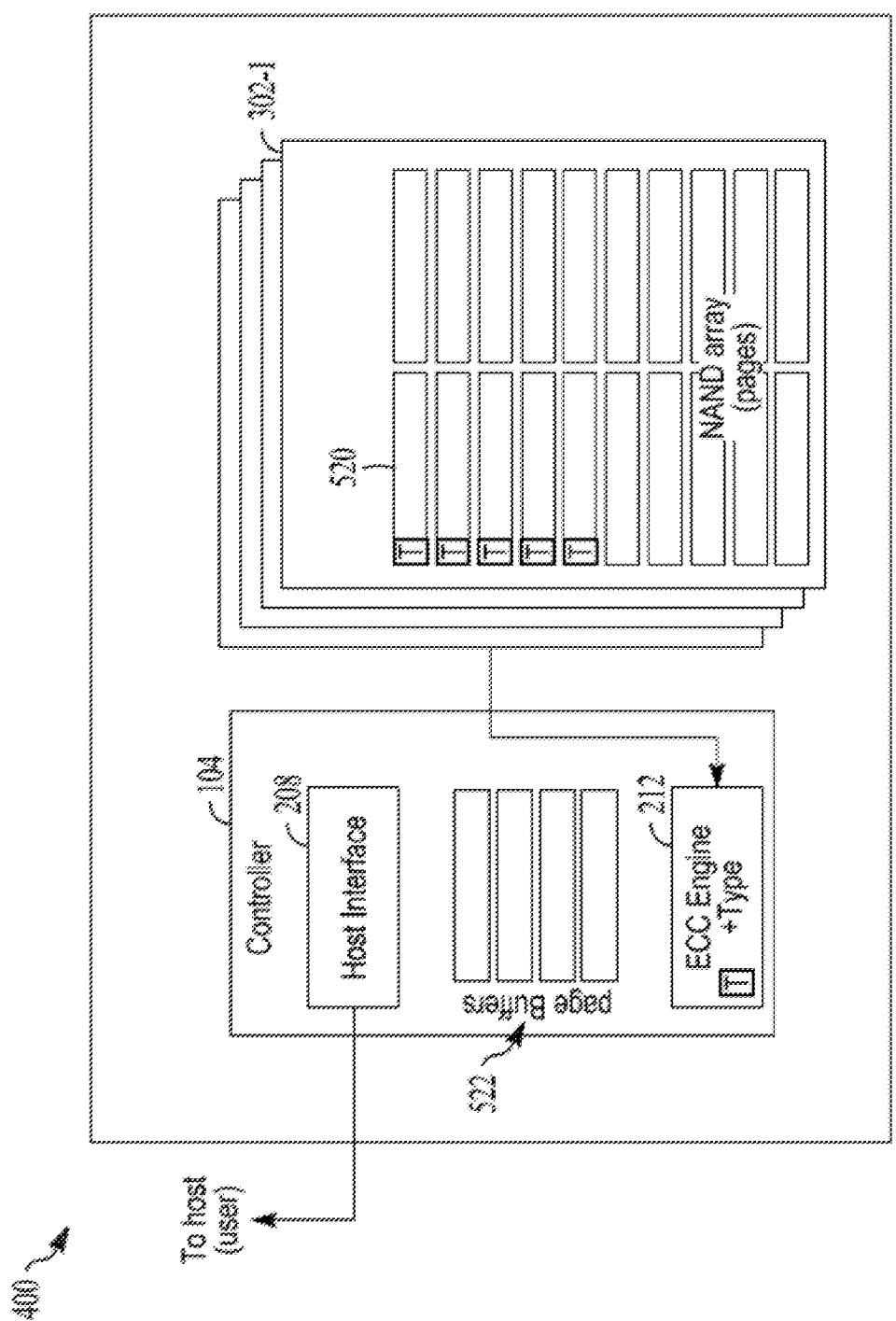
FIG. 4 generally illustrates a memory device according to the principles of the present disclosure.

FIG. 4 generally illustrates a block diagram of a firmware managed memory device 400 according to the principles of the present disclosure. The memory device 400 may include features similar to the storage system 102. For example, the memory device includes the controller 104 and one or more memory blocks 302, such as the memory block 302-1 of the memory die 110. The memory block 302-1, and any other suitable memory block 302-1 to 302-N of the memory die 110, includes a plurality of pages 520. As described, the controller 104 is in communication with one or more data sources, such as the host 106 and/or any other suitable data source. The controller 104 includes the host interface 208, as described, a plurality of page buffers 522, and the ECC engine 212.

In some embodiments, the firmware (e.g., of the controller 104 or of the memory device 400) communicates a respective data type to the ECC engine 212 when requesting the ECC engine 212 to write to a first page 520. The ECC engine 212 sets the data type of the first page 520 during the write operation and verifies the data type of the respective page 520 when the ECC engine 212 performs a read operation on the respective page 520 (e.g., to prevent accidental access to incorrect data types).

Figure 5:
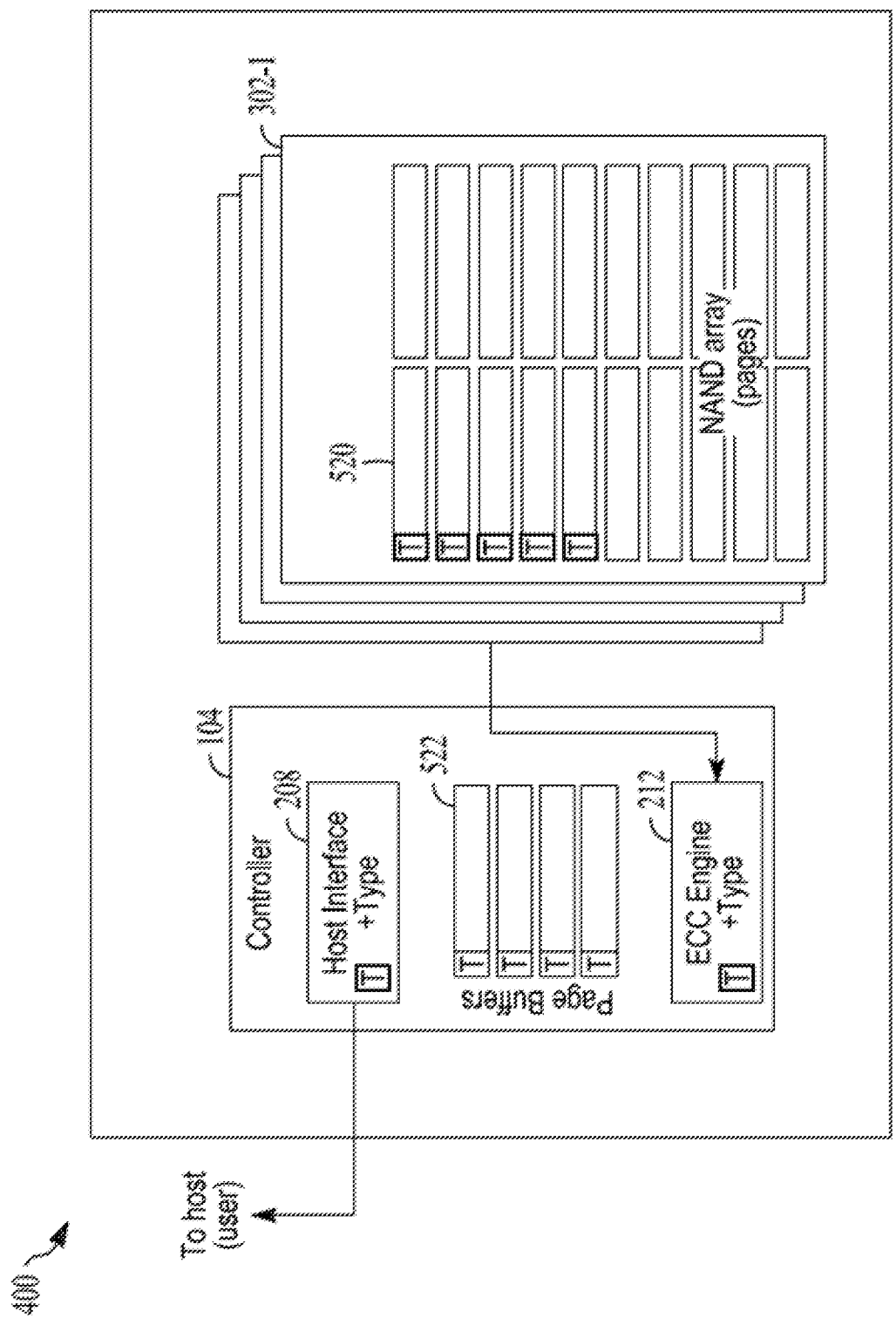
FIG. 5 generally illustrates an alternative memory device according to the principles of the present disclosure.

FIG. 5 generally illustrates an alternative embodiment of the memory device 400. As is generally illustrated in FIG. 5, the data type may be managed and negotiated by three separate hardware components of the controller 104. The hardware components may include the host interface module 208, the page buffers 522 (e.g., dedicated hardware page buffers), and the ECC engine 212. The page buffers 522 each have an associated type field that is not adjustable and/or changeable by the firmware of the memory device 400. In some embodiments, when host data is being read or written via the host interface 208, the host interface 208 will set the data type (e.g., host data) in the page 520 being read from or written to. In some embodiments, when the controller 104 is in communication with more than one host, the host interface 208 assigns a corresponding data type to each respective host (e.g., Host #1, Host #2, Host #3, etc.).

In some embodiments, the page buffers 522 selectively allow or restrict access to data stored in the page buffers 522 based on the data type and the operation requested in a manner similar to a firewall in a network setup. For example, if a host controller instructs Host #3 to read from a page buffer 522 that has a data type corresponding to Host #2 or which belongs to firmware management information, the page buffer 522 does not allow the Host #3 to read data stored in the page buffer 522 or corresponding page 520.

Additionally, or alternatively, firmware of the memory device 400 may be allowed to access and/or modify data in page buffers 522 when the page buffers 522 determine that the data type associated with the firmware corresponds to the data type of the respective page buffer(s) 520. The ECC engine 212 may write to a page 520 and set corresponding data type to the page 520. The ECC engine 212, upon reading the data of the page 520, communicates the data type of the page 520 together with the data read from the page 520 to a corresponding page buffer 522 to track.

In some embodiments, the storage system 102 and/or the memory device 400 may implement cryptographically end-to-end secure protection in addition to the data storage systems and methods described herein. For example, the storage system 102 and/or the memory device 400 may add a signature and/or authentication capabilities to various hardware components described herein. In some embodiments, the cryptographically end-to-end secure protection implementation may include collaborating with hosts, such as the host 106 or other suitable hosts, where each host is responsible for a corresponding key, which may allow full end-to-end secure access to data from different data sources. In some embodiments, the signature may be part of or stored in a respective page 520 (e.g., because the signature may be too large to store in the spare bits of pages 520).

In some embodiments, the controller 104 may perform the methods described herein. However, the methods described herein as performed by the controller 104 are not meant to be limiting, and any type of software executed on a controller can perform the methods described herein without departing from the scope of this disclosure. For example, a controller such as a processor executing software within the host 106 or firmware within the storage system 102 (e.g., stored on ROM 232 or NVM memory block 110) can perform the methods described herein.

Figure 6:
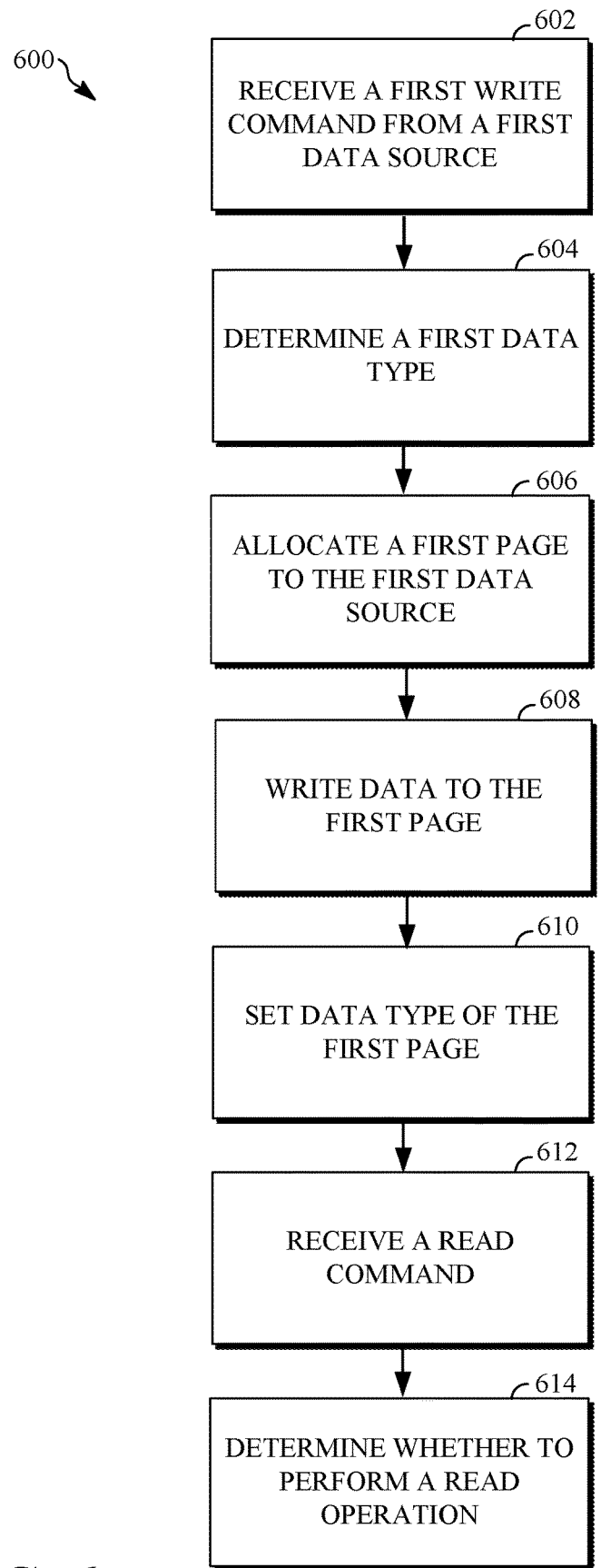
FIG. 6 is a flow diagram generally illustrating a data storage method according to the principles of the present disclosure.

FIG. 6 is a flow diagram illustrating a data storage method 600 according to the principles of the present disclosure. At 602, the method 600 receives a first write command from a first data source. For example, the controller 104 receives the first write command from the first data source. At 604, the method 600 determines a first data type. For example, the controller 104 determines the first data type associated with the first data source. At 606, the method 600 allocates a first page to the first data source. For example, the controller 104 allocates the first page of the memory block 302-1 to the first data source. In some embodiments, the first page may be a portion of a single NAND page. At 608, the method 600 writes data to the first page. For example, the controller 104 instructs the ECC engine 212 to write data to the first page according to the first write command. The ECC engine 212 performs a write operation on the first page according to the first write command. At 610, the method 600 sets the data type of the first age. For example, the controller 104 communicates the first data type to the ECC engine 212. The ECC engine 212, during performance of the write operation, sets the data type of the first page based on the first data type.

At 612, the method 600 receives a read command. For example, the controller 104 receives a read command from any suitable data source instructing the controller 104 to perform read operation on the first page. The controller 104 determines the data type associated with the data source. The controller 104 instructs the ECC engine 212 to perform a read operation according to the read command and communicates the data type associated with the data source to the ECC engine 212. At 614, the method 600 determines whether to perform the read operation. For example, the ECC engine 212 compares the data type associated with the data source to the data type of the first page. When the ECC engine 212 determines that the data type associated with the data source is the same as the data type of the first page, the ECC engine 212 performs the read operation on the first page, as described. Conversely, when the ECC engine 212 determines that data type associated with the data source is not the same as the data type of the first page, the ECC engine 212 does not perform the read operation, as described.

In some embodiments, a method for storing data in a memory system includes receiving a first write command from a first data source. The method also includes determining a first data type associated with the first data source. The method also includes allocating a first page of a memory block to the first data source. The method also includes during performance of a write operation to the first page: writing data to the first page based on the first write command; and setting, on the first page, a data type of the first page based on the first data type. The method also includes receiving a read command to perform a read operation on the first page from one of a plurality of data sources, the plurality of data sources including the first data source. The method also includes determining a data type associated with the one of the plurality of data sources. The method also includes determining whether to perform the read operation on the first page based on the data type of the first page and the data type associated with the one of the plurality of data sources.

In some embodiments, determining whether to perform the read operation on the first page based on the data type of the first page and the data type associated with the one of the plurality of data sources includes determining whether the data type associated with the one of the plurality of data sources is the data type of the first page. In some embodiments, the method also includes, based on a determination that the data type associated with the one of the plurality of data sources is the data type of the first page, performing the read operation. In some embodiments, the method also includes, based on a determination that the data type associated with the one of the plurality of data sources is not the data type of the first page, not performing the read operation. In some embodiments, the one of the plurality of data sources includes the first data source, and the data type associated by the one of the plurality of data sources includes the first data type. In some embodiments, the data type associated with the one of the plurality of data sources includes a second data source different from the first data source and the data type associated by the one of the plurality of data sources includes a second data type different from the first data type. In some embodiments, the method also includes: receiving a second write command from a second data source different from the first data source; determining a second data type associated with the second data source; allocating a second page of the memory block to the second data source; and during performance of a write operating on the second page: writing data to the second page based on the second write command; and setting on the second page, a data type of the second page based on the second data type. In some embodiments, the method also includes: receiving a read command to perform a read operation on the second page from one of the plurality of data sources, the plurality of data sources including the second data source; determining a data type associated with the one of the plurality of data sources; and determining whether to perform the read operation on the second page based on the data type of the second page and the data type associated with the one of the plurality of data sources.

In some embodiments, a controller includes a bus interface and a processor. The bus interface is in communication with one or more memory blocks of a memory system. The processor is configured to: receive a first write command from a first data source; determine a first data type associated with the first data source; allocate a first page of a memory block of the one or more memory blocks to the first data source; and during performance of a write operation to the first page: write data to the first page based on the first write command; and set, on the first page, a data type of the first page based on the first data type. The processor is further configured to: receive a read command to perform a read operation on the first page from one of a plurality of data sources, the plurality of data sources including the first data source; determine a data type associated with the one of the plurality of data sources; and determine whether to perform the read operation on the first page based on the data type of the first page and the data type associated with the one of the plurality of data sources.

In some embodiments, the processor is further configured to determine whether the data type associated with the one of the plurality of data sources is the data type of the first page. In some embodiments, the processor is further configured to, based on a determination that the data type associated with the one of the plurality of data sources is the data type of the first page, perform the read operation. In some embodiments, the processor is further configured to, based on a determination that the data type associated with the one of the plurality of data sources is not the data type of the first page, not perform the read operation. In some embodiments, the one of the plurality of data sources includes the first data source and the data type associated by the one of the plurality of data sources includes the first data type. In some embodiments, the data type associated with the one of the plurality of data sources includes a second data source different from the first data source and the data type associated by the one of the plurality of data sources includes a second data type different from the first data type. In some embodiments, the processor is further configured to: receive a second write command from a second data source different from the first data source; determine a second data type associated with the second data source; allocate a second page of the memory block to the second data source; and during performance of a write operating on the second page: write data to the second page based on the second write command; and set on the second page, a data type of the second page based on the second data type. In some embodiments, the processor is further configured to: receive a read command to perform a read operation on the second page from one of the plurality of data sources, the plurality of data sources including the second data source; determine a data type associated with the one of the plurality of data sources; and determine whether to perform the read operation on the second page based on the data type of the second page and the data type associated with the one of the plurality of data sources.

In some embodiments, a system for storing data in a memory system includes at least one memory block and a controller means in communication with the at least one memory block, the controller configured for: receiving a first write command from a first data source; determining a first data type associated with the first data source; allocating a first page of the at least one memory block to the first data source; and during performance of a write operation to the first page: writing data to the first page based on the first write command; and setting, on the first page, a data type of the first page based on the first data type. The controller means is further configured for: receiving a second write command from a second data source different from the first data source; determining a second data type associated with the second data source; allocating a second page of the at least one memory block to the second data source; and during performance of a write operating on the second page: writing data to the second page based on the second write command; and setting on the second page, a data type of the second page based on the second data type.

In some embodiments, the controller means is further configured for: receiving a read command to perform a read operation on one of the first page and the second page from one of a plurality of data sources, the plurality of data sources including at least the first data source and the second data source; determining a data type associated with the one of the plurality of data sources; and determining whether to perform the read operation on the one of the first page and the second page based on the data type of the one of the first page and the second page and the data type associated with the one of the plurality of data sources. In some embodiments, the first data source includes a first host and the second data source includes a second host. In some embodiments, the controller means includes an error correction code engine means configured for performing at least the write operation to the first page and the write operation to the second page.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module. In some embodiments, the controller 104 is implemented within the host 106 can be configured with hardware and/or firmware to perform the various functions described herein.

"Controller" shall mean individual circuit components, an application-specific integrated circuit (ASIC), a microcontroller with controlling software, a digital signal processor (DSP), a processor with controlling software, a field programmable gate array (FPGA), or combinations thereof.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for storing data in a memory system, the memory system comprising a non-volatile memory block and a controller, the method comprising:
    the controller receiving a first write command from a first data source;
    the controller determining a first data type associated with the first data source;
    the controller allocating a first page of a memory block to the first data source;
    during performance of a write operation to the first page:
        an error correction code (ECC) engine of the controller writing data to the first page based on the first write command; and
        the ECC engine setting, in one or more bits of the first page, a value that indicates a data type of the first page based on the first data type;
    the controller receiving a read command to perform a read operation on the first page from one of a plurality of data sources, the plurality of data sources including the first data source;
    the controller determining a data type associated with the one of the plurality of data sources; and
    the ECC engine determining whether to perform the read operation on the first page based on the data type of the first page and the data type associated with the one of the plurality of data sources.

2. The method of claim 1, wherein the controller determining whether to perform the read operation on the first page based on the data type of the first page and the data type associated with the one of the plurality of data sources includes the controller communicating the data type associated with the one of the plurality of data sources to the ECC engine, and the ECC engine determining whether the data type associated with the one of the plurality of data sources is the data type of the first page.

3. The method of claim 2, further comprising, based on a determination that the data type associated with the one of the plurality of data sources is the data type of the first page, the ECC engine performing the read operation.

4. The method of claim 2, further comprising, based on a determination that the data type associated with the one of the plurality of data sources is not the data type of the first page, the ECC engine not performing the read operation.

5. The method of claim 1, wherein the one of the plurality of data sources includes the first data source and wherein the data type associated by the one of the plurality of data sources includes the first data type.

6. The method of claim 1, wherein the data type associated with the one of the plurality of data sources includes a second data source different from the first data source and wherein the data type associated by the one of the plurality of data sources includes a second data type different from the first data type.

7. The method of claim 1, further comprising:
    the controller receiving a second write command from a second data source different from the first data source;
    the controller determining a second data type associated with the second data source;
    the controller allocating a second page of the memory block to the second data source; and
    during performance of a write operating on the second page:
        the controller writing data to the second page based on the second write command; and
        the ECC engine setting, in one or more bits of the second page, a value that indicates a data type of the second page based on the second data type.

8. The method of claim 7, further comprising:
    the controller receiving a read command to perform a read operation on the second page from one of the plurality of data sources, the plurality of data sources including the second data source;
    the controller determining a data type associated with the one of the plurality of data sources; an
    the ECC engine determining whether to perform the read operation on the second page based on the data type of the second page and the data type associated with the one of the plurality of data sources.

9. The method of claim 1, the controller comprising a host interface module configured to interface with the plurality of data sources, a plurality of page buffers each having an associated type field, and the ECC engine, the method further comprising:
    a page buffer of the plurality of page buffers permitting or restricting a read from the page buffer based on the associated type field of the page buffer and a data type of a host requesting the read.

10. A controller, comprising:
    a bus interface in communication with one or more memory blocks of a memory system; and
    a processor comprising a control logic and an error correction code (ECC) engine;
    the control logic configured to:
        receive a first write command from a first data source;
        determine a first data type associated with the first data source;
        allocate a first page of a memory block of the one or more memory blocks to the first data source;
    during performance of a write operation to the first page, the ECC engine configured to:
        write data to the first page based on the first write command; and
        set, in one or more bits of the first page, a value that indicates a data type of the first page based on the first data type;

the control logic further configured to:
 receive a read command to perform a read operation on the first page from one of a plurality of data sources, the plurality of data sources including the first data source;
 determine a data type associated with the one of the plurality of data sources; and
 the ECC engine further configured to determine whether to perform the read operation on the first page based on the data type of the first page and the data type associated with the one of the plurality of data sources.

11. The controller of claim 10, wherein the control logic is further configured to determine whether the data type associated with the one of the plurality of data sources is the data type of the first page.

12. The controller of claim 11, wherein the ECC engine is further configured to, based on a determination that the data type associated with the one of the plurality of data sources is the data type of the first page, perform the read operation.

13. The controller of claim 11, wherein the ECC engine is further configured to, based on a determination that the data type associated with the one of the plurality of data sources is not the data type of the first page, not perform the read operation.

14. The controller of claim 10, wherein the one of the plurality of data sources includes the first data source and wherein the data type associated by the one of the plurality of data sources includes the first data type.

15. The controller of claim 10, wherein the data type associated with the one of the plurality of data sources includes a second data source different from the first data source and wherein the data type associated by the one of the plurality of data sources includes a second data type different from the first data type.

16. The controller of claim 10,
 wherein the control logic is further configured to:
  receive a second write command from a second data source different from the first data source;
  determine a second data type associated with the second data source;
  allocate a second page of the memory block to the second data source; and
 wherein the ECC engine is further configured to, during performance of a write operating on the second page:
  write data to the second page based on the second write command; and
  set, in one or more bits of the second page, a value that indicates a data type of the second page based on the second data type.

17. The controller of claim 16,
 wherein the control logic is further configured to:
  receive a read command to perform a read operation on the second page from one of the plurality of data sources, the plurality of data sources including the second data source;
  determine a data type associated with the one of the plurality of data sources; and
 wherein the ECC engine is further configured to determine whether to perform the read operation on the second page based on the data type of the second page and the data type associated with the one of the plurality of data sources.

18. A system for storing data in a memory system, the system comprising:
 at least one memory block;
 controller means in communication with the at least one memory block; and
 error correction code (ECC) means;
 the controller means configured for:
  receiving a first write command from a first data source;
  determining a first data type associated with the first data source;
  allocating a first page of the at least one memory block to the first data source;
 the ECC means configured for, during performance of a write operation to the first page:
  writing data to the first page based on the first write command; and
  setting, in one or more bits of the first page, a value that indicates a data type of the first page based on the first data type;
 the controller means further configured for:
  receiving a second write command from a second data source different from the first data source;
  determining a second data type associated with the second data source; and
  allocating a second page of the at least one memory block to the second data source; and
 the ECC means further configured for, during performance of a write operating on the second page:
  writing data to the second page based on the second write command; and
  setting, in one or more bits of on the second page, a value that indicates a data type of the second page based on the second data type.

19. The system of claim 18,
 wherein the controller means is further configured for:
  receiving a read command to perform a read operation on one of the first page and the second page from one of a plurality of data sources, the plurality of data sources including at least the first data source and the second data source;
  determining a data type associated with the one of the plurality of data sources; and
 wherein the ECC means is further configured for, determining whether to perform the read operation on the one of the first page and the second page based on the data type of the one of the first page and the second page and the data type associated with the one of the plurality of data sources.

20. The system of claim 18, wherein the first data source includes a first host and the second data source includes a second host.

* * * * *